(12) United States Patent
Asagi et al.

(10) Patent No.: US 10,189,119 B2
(45) Date of Patent: Jan. 29, 2019

(54) SOLDER ALLOY FOR DIE BONDING

(71) Applicants: Nihon Handa Co., Ltd., Tokyo (JP); Fuji Electric Co., Ltd., Kawasaki-shi (JP)

(72) Inventors: Takeshi Asagi, Ichihara (JP); Susumu Mitani, Ichihara (JP); Hirohiko Watanabe, Kawasaki (JP); Masayoshi Shimoda, Kawasaki (JP)

(73) Assignees: Nihon Handa Co., Ltd. (JP); Fuji Electric Co., Ltd. (JP)

( * ) Notice: Subject to any disclaimer, the term of this patent is extended or adjusted under 35 U.S.C. 154(b) by 96 days.

(21) Appl. No.: 14/433,295

(22) PCT Filed: Jan. 21, 2014

(86) PCT No.: PCT/JP2014/051049
§ 371 (c)(1),
(2) Date: Apr. 2, 2015

(87) PCT Pub. No.: WO2014/115699
PCT Pub. Date: Jul. 31, 2014

(65) Prior Publication Data
US 2015/0258637 A1 Sep. 17, 2015

(30) Foreign Application Priority Data
Jan. 28, 2013 (JP) ................. 2013-013079

(51) Int. Cl.
*B23K 1/00* (2006.01)
*H05K 3/34* (2006.01)
*B23K 35/02* (2006.01)
*B23K 35/26* (2006.01)
*C22C 12/00* (2006.01)
*H01L 23/00* (2006.01)
*B23K 101/42* (2006.01)

(52) U.S. Cl.
CPC .......... *B23K 35/264* (2013.01); *B23K 1/0016* (2013.01); *B23K 35/025* (2013.01); *B23K 35/26* (2013.01); *C22C 12/00* (2013.01); *H01L 24/13* (2013.01); *H05K 3/3457* (2013.01); *H05K 3/3463* (2013.01); *H05K 3/3484* (2013.01); *B23K 2101/42* (2018.08); *H01L 2224/13113* (2013.01); *H01L 2924/01322* (2013.01); *H01L 2924/12042* (2013.01)

(58) Field of Classification Search
CPC ...... B23K 35/264; B23K 35/025; C22C 12/00
See application file for complete search history.

(56) References Cited

U.S. PATENT DOCUMENTS

| | | | | |
|---|---|---|---|---|
| 5,817,188 A | * | 10/1998 | Yahatz | H01L 35/08 136/237 |
| 2004/0170524 A1 | * | 9/2004 | Lambracht | B23K 35/264 420/577 |
| 2008/0075401 A1 | | 3/2008 | Dorner et al. | |
| 2009/0166876 A1 | | 7/2009 | Fujiwara et al. | |
| 2010/0035072 A1 | | 2/2010 | Watanabe et al. | |
| 2010/0159257 A1 | * | 6/2010 | Yamaguchi et al. | 428/457 |
| 2010/0294550 A1 | | 11/2010 | Furusawa et al. | |
| 2013/0121874 A1 | * | 5/2013 | Ueshima et al. | 420/577 |

FOREIGN PATENT DOCUMENTS

| | | | |
|---|---|---|---|
| CN | 101332544 A | * | 12/2008 |
| CN | 101909809 A | | 12/2010 |
| JP | 2004025232 A | | 1/2004 |
| JP | 2004-114093 | * | 4/2004 |
| JP | 2004114093 A | | 4/2004 |
| JP | 2004528992 A | | 9/2004 |
| JP | 2005503926 A | | 2/2005 |
| JP | 3671815 B2 | | 7/2005 |
| JP | 2007018288 A | | 1/2007 |
| JP | 2007181880 A | | 7/2007 |
| JP | 2007301570 A | | 11/2007 |
| JP | 2007313526 A | | 12/2007 |
| JP | 2009158725 A | | 7/2009 |
| JP | 2012076130 A | | 4/2012 |
| JP | 2013022638 A | | 2/2013 |
| JP | 2014024109 A | | 2/2014 |
| WO | 02101105 A1 | | 12/2002 |
| WO | 03026828 A2 | | 4/2003 |
| WO | 2007018288 A1 | | 2/2007 |
| WO | 2009143677 A1 | | 12/2009 |
| WO | 2012002173 A1 | | 1/2012 |

(Continued)

OTHER PUBLICATIONS

Chinese Office Action for Application No. 201480002628.3 dated May 4, 2016.
International Search Report for Application No. PCT/JP2014/051049 dated Apr. 8, 2014.
Korean Office Action for Application No. 10-2015-7008257 dated Jun. 16, 2016.
German Office Action for Application No. 112014000193.7 dated Aug. 5, 2016.

(Continued)

*Primary Examiner* — C Melissa Koslow
(74) *Attorney, Agent, or Firm* — Lerner, David, Littenberg, Krumholz & Mentlik, LLP

(57) ABSTRACT

An object of the invention is to provide a lead-free solder for die bonding having a high heat resistance temperature and an improved wetting property. Provided are a solder alloy for die bonding which contains 0.05% by mass to 3.0% by mass of antimony and the remainder consisting of bismuth and inevitable impurities, and a solder alloy for die bonding which contains 0.01% by mass to 2.0% by mass of germanium and the remainder consisting of bismuth and inevitable impurities.

8 Claims, 5 Drawing Sheets

(56) References Cited

FOREIGN PATENT DOCUMENTS

WO    WO 2012002173 A1 *  1/2012

OTHER PUBLICATIONS

Report on Results of Environment-Conscious Advanced Packaging Technology (Jul. 2011) by the Japan Electronics and Information Technology Industries Association (JEITA).

* cited by examiner

FIG.5

| SAMPLE | | Bi100 | Bi-0.08Ni | Bi-0.08Ge | Bi-1.8Sb | Bi-0.04 Ge-0.9Sb |
|---|---|---|---|---|---|---|
| Cu PLATE | PHOTOGRAPHS OF EXTERNAL APPEARANCE | | | | | |
| | RATE OF SPREAD | 62.2% | 59.3% | 83.8% | 75.7% | 79.8% |
| Ni PLATE | PHOTOGRAPHS OF EXTERNAL APPEARANCE | | | | | |
| | RATE OF SPREAD | 89.8% | 88.5% | 91.6% | 93.2% | 91.8% |

SOLDER ALLOY FOR DIE BONDING

CROSS REFERENCE TO RELATED APPLICATIONS

The present application is a national phase entry under 35 U.S.C. § 371 of International Application No. PCT/JP2014/051049 filed Jan. 21, 2014, published in Japanese, which claims priority from Japanese Patent Application No. 2013-013079 filed Jan. 28, 2013, all of which are hereby incorporated by reference herein.

BACKGROUND OF THE INVENTION

Technical Field

The present invention relates to a solder alloy. More specifically, the present invention relates to an inexpensive lead-free high-temperature solder alloy used instead of conductive adhesives and in die bonding for bonding of a back side of a device such as a power device.

Background Art

Sn—Pb eutectic solders or Pb-based solder alloys containing 90% by mass or more of lead (Pb) that have been conventionally used contain lead, which is a toxic substance, and therefore, the use of such solders or solder alloys has been restricted. In recent years, Sn—Ag eutectic solders or Sn—Ag—Cu-based solders that do not contain lead have become widespread and have been used for bonding between electronic components and printed circuit boards. However, if a lead-free solder mainly consisting of Sn is used, the soldered part is subjected to a high heat of a temperature as high as 260° C., for example, and therefore, a problem of poor heat resistance, such as melting of electrodes or breaking of wires, may arise with respect to internal bonding of electronic parts.

In addition, in the field of power devices, it has been more and more desired to use power devices at high temperatures, and the specifications of operation temperature required for such power device products have been raised from a conventional operation temperature specification of around 150° C., which is of a level of a low temperature reached by self heating, to 175° C., and then to 200° C. Accordingly, it has been also desired to improve the heat resistance of bonding portions of power devices. In 2011 Report on Results of Environment-Conscious Advanced Packaging Technology (July 2011) by the Japan Electronics and Information Technology industries Association (JEITA), it has been reported that the heat resistance can be secured by conventional techniques by employing a Pb-based composition (a material mainly consisting of lead and having a melting point of 290° C. or higher, for example). According to some other reports, a temperature of 260° C. or higher is required as the heat resistance temperature for portions to be bonded by die bonding, which are used for internal bonding of electronic parts. Sn—Ag—Cu-based solders have become widespread for use as conductive adhesives and Pb-free solders, and with respect to such Sn—Ag—Cu-based solders, the solidus temperature is around 220° C., and therefore Sn—Ag—Cu-based solders may be incited at the required heat resistance temperature of 260° C. described above. Therefore, the problem of poor heat resistance described above, such as melting of electrodes or breaking of wires, may arise in some cases.

Pb-based solders with a high Pb content have a high solidus temperature of 290° C. or higher, which satisfy the required heat resistance; however, the use of lead has been restricted. High-temperature solders, which have a high solidus temperature similarly to the Pb-based solders described above, include solders constituted by a noble metal such as Au-20% Sn (solidus temperature: 280° C.), Au-3.6% Si (solidus temperature: 370° C.), and Au-25% In (solidus temperature: 370° C.). However, because these solder alloys are very expensive, it is difficult to use them commonly as a substitute material for Pb-based solders.

Bi-based alloys include a high-temperature solder produced on the basis of Bi—Ag-based materials (solidus temperature: 262° C.) of which the characteristics have been improved by adding additional elements (see Patent Literatures 1 and 2). However, because the melting point has no sufficient margin from the required heat resistance temperature of 260° C., a problem may arise in that any small excess of the peak temperature over the required heat resistance temperature would cause the material to melt, which may lead to poor bonding.

In addition, a composition is known in which a very small amount of element having a remarkably low eutectic point, such as tin (Sn) or indium (In), is added to bismuth (Bi) (eutectic point of a Bi—Sn eutectic crystal: 139° C., eutectic point of a Bi—In eutectic crystal: 109.5° C.) (see Patent Literature 3). However, if the material is contaminated with Sn or In and even if the amount of Sn or In is as very small as 1,000 ppm or lower, the material may be segregated, and the material may be melted in low melting point phases that may be formed in the segregated portion, which may thereby cause degradation of mechanical characteristics and long-term environmental resistance: i.e., the life of the material may be shortened.

A through-type ceramic condenser has been known in which a solder mainly consisting of Bi and including components such as silver (Ag) or antimony (Sb) that has been loaded thereto is charged into a hole of the structure (see Patent Literature 4). However, such an invention is intended for insertion mounting type components. In addition, the characteristic required for solders is to not volumetrically shrink due to solidification, which is different from the characteristic required for solders for die bonding.

In addition, Pb-free solders for use at high temperatures, which mainly consist of Bi, have been known (see Patent Literature 5). However, such an invention contains zinc (Zn) and Sn as essential constituents, and it is disclosed therein that Bi—Ge-based solders, which do not include Zn or Sn, are not appropriate as solders due to their poor workability and wettability.

LIST OF PRIOR ART REFERENCES

Patent Literature

Patent Literature 1: JP 2005-503926 W
Patent Literature 2: JP 3671815 B1
Patent Literature 3: JP 2007/018288 X
Patent Literature 4: JP 2007-181880 A
Patent Literature 5: JP 2012-076130 A

SUMMARY OF INVENTION

Technical Problem

The development of a high-temperature solder alloy in which no degradation of its solidus temperature occurs and having improved characteristics such as wettability is desired as an inexpensive lead-free high-temperature solder alloy used for bonding of a portion to be die-bonded of a device such as a power device.

Solution to Problem

Focusing on the characteristics of bismuth (Bi) of which the melting point is close to that of lead, the inventors have found that the wettability and workability of the material can be improved by using a material mainly consisting of bismuth (Bi) and including a very small amount of metal added thereto, and completed the present invention on the basis of this finding. In particular, the inventors have found that by adding a specific amount of antimony (Sb) and/or germanium (Ge) to bismuth (Bi), the metal structure essential to bismuth (Bi) with which brittle failure is easily caused can be engineered to obtain an alloy that can be worked as a solder while maintaining the temperature characteristic useful as a high-temperature solder at the same time.

Specifically, according to an aspect of the present invention, a solder alloy for die bonding includes 0.05% by mass to 3.0% by mass of antimony (Sb) and the remainder consisting of bismuth (Bi) and inevitable impurities. The solder alloy according to the present invention is particularly distinguishable from bonding materials for bonding of terminals of insertion type mounting components, and relates to a solder alloy for die bonding intended for use in die bonding for internal bonding of insertion mounting type components and surface mounting type components such as Quad Flat Package (QFP) and Small Outline Package (SOP) and further for use in bonding by die bonding of bare chips.

In the solder alloy for die bonding, it is preferable that the solder alloy further include 0.01% by mass to 1.0% by mass of germanium (Ge).

In the solder alloy for die bonding, it is preferable that the solder alloy further include 0.05% by mass to 1.0% by mass of antimony (Sb) and 0.01% by mass to 0.2% by mass of germanium (Ge).

In the solder alloy for die bonding, it is preferable that the solder alloy further include 0.01% by mass to 0.1% by mass of nickel (Ni).

In the solder alloy for die bonding, it is preferable that the solder alloy further include 0.001% by mass to 0.1% by mass of phosphorus (P).

According to another aspect of the present invention, a solder alloy for die bonding includes 0.01% by mass to 2.0% by mass of germanium (Ge) and the remainder consisting of bismuth (Bi) and inevitable impurities.

According to another aspect of the present invention, a solder paste includes a solder alloy and a flux, and the solder alloy includes 0.01% by mass to 2.0% by mass of germanium (Ge) and the remainder consisting of bismuth (Bi) and inevitable impurities.

Advantageous Effects of Invention

A lead-free solder alloy for die bonding that is highly reliable even at high temperatures can be obtained by providing an alloy containing Sb and/or Ge loaded to Bi by a specific amount, which is thereby capable of preventing bonding failures such as wet dents or voids and poor formation of a soldering fillet in the portions to be bonded, which are considered to be the adverse effects that may arise due to the low wettability uniquely characteristic to Bi, and also capable of suppressing the threat of failures such as cracks or broken wires occurring in relation to distortions generated due to a difference in the coefficients of thermal expansion in the portions to be bonded with materials of different types. In addition, by further adding Ni to these compositions, the bondability can be improved, and by further adding P to these compositions, oxidation can be suppressed and the workability can be improved.

BRIEF DESCRIPTION OF DRAWINGS

FIG. 3(b) is a magnified view of the portion of FIG. 3(a) indicated by a broken line rectangle.

FIG. 4(b) is a magnified view of the portion of FIG. 4(a) indicated by a broken line rectangle.

FIG. 5 shows photographs that illustrate the wettability obtained in cases in which solder alloys of Examples of the present invention and Comparative Examples were mixed with a flux and where soldering was carried out on a Cu plate and an Ni plate by using the mixture.

DESCRIPTION OF EMBODIMENTS

Embodiments of the present invention will be described below with reference to attached drawings. However, the present invention is not limited by the embodiments described below.

First Embodiment: A Bi—Sb Binary Alloy

According to the first embodiment of the present invention, a solder alloy for die bonding contains 0.05% by mass to 3.0% by mass of Sb, and the remainder consists of Bi and inevitable impurities. The inevitable impurities mainly include copper (Cu), Ni, zinc (Zn), iron (Fe), aluminium (Al), arsenic (As), cadmium (Cd), Ag, gold (Au), In, P, Pb, Sn, and the like. In particular, the solder alloy according to the present invention is characteristic in that it does not include Sn except for Sn contained in the inevitable impurities. This exclusion of Sn is intended to prevent the melting point of the solder alloy from being lowered due to the presence of a Bi—Sn eutectic composition. In addition, the solder alloy according to the present invention is a lead-free solder alloy that does not include Pb.

Figure 1:
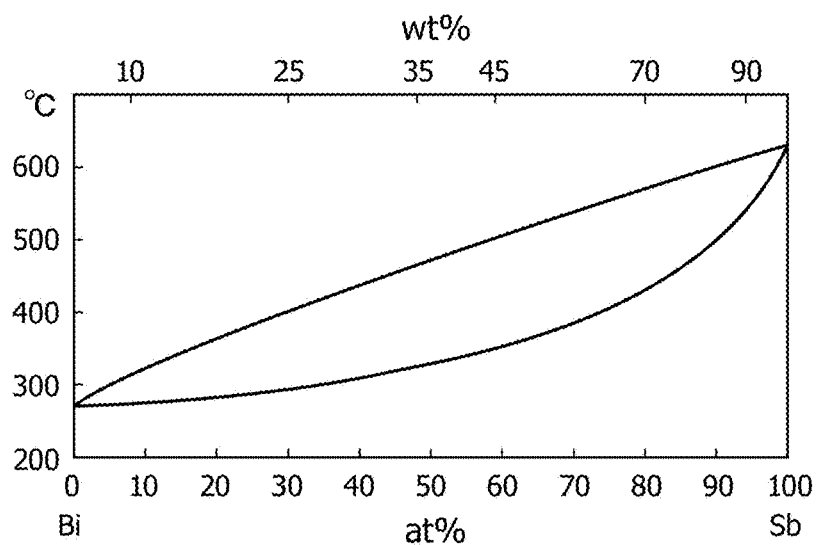
FIG. 1 is a binary phase diagram which illustrates a Bi—Sb-based alloy.

FIG. 1 is a binary phase diagram which illustrates a Bi—Sb-based alloy. Referring to FIG. 1, it is known that the solidus temperature of a solder alloy containing 0.05% by mass to 3.0% by mass of Sb is within a solidus temperature range of 271 to 275° C. and that the alloy functions as a high-temperature solder. As illustrated in FIG. 1, Sb is a whole solid solution type alloy in relation to Bi. Sb is not a precipitation hardening type material that has no compatibility as a Bi—Ag-based alloy represented by Bi-2.5% Ag and turns into an eutectoid. Accordingly, a distortion mitigating effect similar to that of solid solution-hardening type materials is expected, which is observed when Pb-based alloys are used.

The solder alloy containing 0.05% by mass to 3.0% by mass of Sb and including the remainder constituted by Bi and inevitable impurities can be easily rolled and also has an excellent plastic workability. Further, by controlling the content of Sb within the above-described range, the wettability of the Bi—Sb alloy can be significantly improved compared with the case of using Bi alone.

More preferably, the content of Sb may be 0.05% by mass to 2.0% by mass, and yet more preferably, the content of Sb may be 1% by mass to 1.75% by mass. This is because if the content of Sb is controlled within these ranges, the alloy becomes most effective in terms of both the wettability and the workability.

The solder alloy according to the present embodiment can be prepared by melting the stocks Bi and Sb in an electric furnace in accordance with an ordinary method. It is preferable to use materials with a purity of 99.99% by mass or higher as the materials.

In addition, the solder alloy according to the present embodiment can be worked in the form of a plate-like preform material, a formed solder, or a solder paste prepared by powdering the materials and mixing the powder with a flux.

If the solder alloy is to be provided in the form of a solder paste prepared by working the materials into the form of powder and mixing the powder with a flux, with respect to the particle size of the powdered solder, it is preferable to use a powdered solder of which the distribution of the particle size is in the range of 10 to 100 μm, and more preferably, 20 to 50 μm. For an average particle size, a powdered solder can be used of which the distribution of the particle size is in the range of 25 to 50 μm, for example, by measurement carried out by using a common laser diffraction and scattering-type particle-size-distribution measuring apparatus.

For the flux, a freely selected flux can be used, and in particular, a rosin based flux can be preferably used. In order to more effectively improve the wettability, it is especially preferable that the above-described solder paste be used in combination with a flux having a composition including a polymerized rosin of 45 to 55 mass parts, butyl carbitol of 41 to 51 mass parts, a cyclohexylamine HBr salt of 0.5 to 1 mass parts, adipic acid of 0.5 to 1 mass parts, and a hydrogenated castor oil of 2 to 4 mass parts. Alternatively, a flux having a composition including a mixed rosin of 45 to 55 mass parts (polymerized rosin:hydrogenated rosin=1:3), hexyl diglycol of 41 to 51 mass parts, 2,3-dibromo-1,4-butenediol of 0.5 to 5 mass parts, adipic acid of 0.5 to 1 mass parts, and a hydrogenated castor oil of 2 to 4 mass parts can be used. The mass ratio between the flux and the powdered solder is preferably 80:20 to 90:10, and more preferably 85:15 to 90:10.

If the solder alloy is to be provided in the form of a formed solder, a member to be bonded can be bonded by first applying a flux similar to that described above onto the member and mounting the formed solder thereon under a specific temperature profile. The shape and the dimension of the formed solder is not limited to a specific shape or dimension, and the formed solder can have a shape and a dimension that are appropriate for a member to be bonded and commonly used by a person skilled in the art. For the volume of the flux, the flux can be used by such an amount that the volume thereof becomes the same as or about 1.2 times greater than that of the formed solder. Specifically, the temperature profile may include a preheating step for carrying out heating at 150 to 220° C., preferably at 170 to 200° C., for 100 to 130 seconds and a step for maintaining the temperature at 270° C. or higher for 40 to 120 seconds with a heating peak temperature at 350° C. or lower. By bonding the solder alloy according to the present invention in combination with a specific flux under the above-described temperature profile, the wettability of the solder alloy can be remarkably improved.

If the solder alloy is to be provided in the form of a formed solder, the bonding can be carried out by using an active atmosphere such as a hydrogen atmosphere or a formic acid atmosphere. In this case, the alloy is heated up to the solidus temperature of Bi of 270° C. or higher, and the heating peak temperature is set to a temperature higher than the liquidus temperature of the alloy by 30° C. For the heating time, an excellent wettability can be obtained by maintaining the heated state for at least 60 seconds. For the heating peak temperature, it is not always necessary to carry out heating up to the liquidus temperature or higher, and if the component of the alloy is close to that of pure Bi, excellent bonding can be secured even under an active atmosphere by performing the heating at a temperature of around 270° C., which is the solidus temperature of pure Bi, +30° C.

Second Embodiment: A Bi—Ge Binary Alloy

According to the second embodiment of the present invention, a solder alloy for die bonding contains 0.01% by mass to 2.0% by mass of Ge, and the remainder consists of Bi and inevitable impurities. The solder alloy according to the second embodiment also is a lead-free solder alloy which does not include Sn or Pb except for Sn or Pb contained in the inevitable impurities.

Figure 2:
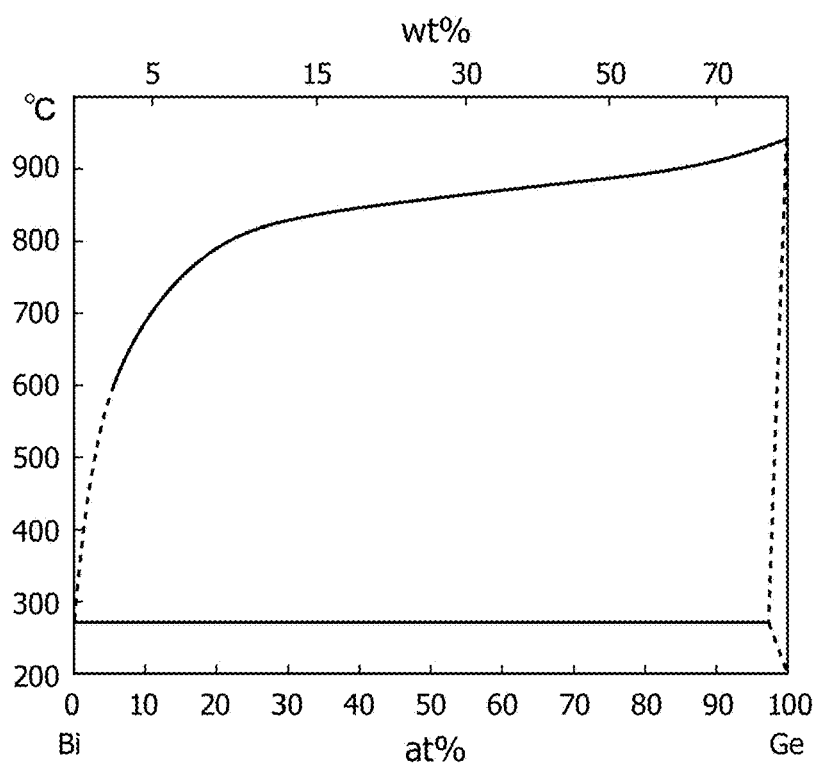
FIG. 2 is a binary phase diagram which illustrates a Bi—Ge-based alloy.

FIG. 2 is a binary phase diagram which illustrates a Bi—Ge-based alloy. Referring to FIG. 2, it is known that the solidus temperature of a solder alloy containing 0.01% by mass to 2.0% by mass of Ge is 271° C. and that the alloy functions as a high-temperature solder. By adding Ge, which is considered having a high compatibility with oxygen, to the base of Bi, oxidation of Bi can be prevented and the bonding characteristics of the solder can be improved by preventing occurrence of internal flaws (holes) in the solder, which may occur due to the presence of Bi-based oxides.

More preferably, the solder alloy according to the present embodiment may contain 0.01% by mass to 1.0% by mass of Ge. This is intended to achieve an excellent plastic workability, which can be achieved if the load of Ge is 1% by mass or lower.

More preferably, the solder alloy according to the present embodiment may contain 0.01% by mass to 0.2% by mass of Ge. If the load of Ge is 0.2%© by mass or smaller, the amount of the precipitate becomes small in terms of the alloy structure, which thereby suppresses increase of flaws and decrease of the strength that may occur due to crystallization of the precipitate. Further, by adding Ge, growth of a primary crystal of Bi is suppressed and the particle size of the primary crystal becomes fine. Because the primary crystal is refined as described above, it is considered that brittle failures, which may occur due to cleavage uniquely occurring in Bi, can be suppressed. The primary crystal may be expected to be further refined by using a material that contains more Ge; however, flaws may increase and the strength of the alloy may decrease in this case due to crystallization of the precipitate. In addition, if a material to be added having a high Ge content in which the primary crystal of Bi is more refined is used, then the workability may considerably degrade because the strength becomes high. Therefore, it is useful if the load of Ge be 0.01% by mass to 0.2% by mass as described above.

Yet more preferably, the material may contain 0.01% by mass to 0.1% by mass of Ge. In the present embodiment, the heating peak temperature for bonding is preferably a temperature higher than the liquidus temperature of the material by about 30° C. It is advantageous that the load of Ge be 0.1% by mass or smaller because in this case, the liquidus temperature increases by a level as small as 2° C. to 3° C., and thus, it is possible to set conditions for bonding that use low heat energy without requiring excessive heating. The primary crystal may be expected to be further refined by using a material that contain more Ge as described above; however, if the load of Ge is 0.2% by mass, for example, then the liquidus temperature increases by about 10° C., and thus it becomes necessary to carry out the heating at a higher temperature. Accordingly, it is more preferable that the load of Ge be 0.1% by mass or lower. Most electronic parts are constituted by resins such as epoxy resin, metals, and the like. Although many materials have been improved in terms of the heat resistance temperature in recent years, resins generally have a heat resistance temperature ranging from 280 to 300° C., and considering the reliability of resins, if the bonding is to be performed in the temperature region of about 300° C., it is necessary to very deliberately determine the heating conditions for the bonding. Should the liquidus temperature to rise by about 10° C. in this temperature region, there arises a threat of the bonding temperature exceeding the heat resistance temperature of the resin. From these points of view, it is preferable that the solder alloy according to the present embodiment be a solder alloy which has a composition capable of realizing a low liquidus temperature and improving the bonding characteristics of the alloy by suppressing generation of oxides and by refining of the structure, and it is especially suitable if the load of Ge be 0.01% by mass to 0.1% by mass as described above.

The solder alloy according to the present embodiment also can be prepared by melting the stock Bi and Ge in an electric furnace in accordance with an ordinary method, and it is preferable to use materials with a purity of 99.99% by mass or higher as the materials.

The solder alloy according to the present embodiment constituted by a Bi—Ge binary alloy can be provided in the form of a solder paste by working the solder alloy into powder and mixing the powder with a flux. By mixing the solder alloy with a flux, the wettability can be expected to further improve. The particle size of the powdered solder, the type of the flux, and the suitable composition of the flux in this case are the same as those described above in the first embodiment. In addition, the method of use and the bonding method in the case in which the solder alloy is to be provided in the form of a formed solder are the same as those described above in the first embodiment.

Third Embodiment: A Bi—Sb—Ge Ternary Alloy

According to the third embodiment of the present invention, a solder alloy for die bonding contains 0.05% by mass to 3.0% by mass of Sb and 0.01% by mass to 1.0% by mass of Ge, and the remainder consists of Bi and inevitable impurities. By adding Sb and Ge by the load in the above-described ranges, bonding can be performed at a high melting point of 270 to 345° C. while maintaining the solidus temperature of a metal of Bi at 260° C. or higher, and thereby the workability can be improved to a level at which the alloy can be worked as a solder alloy. In addition, the wettability of the alloy can be improved compared with the case of using the metal of Bi alone.

It is more preferable that the solder alloy according to the present embodiment contain 0.05% by mass to 1.0%© by mass of Sb and further contain 0.01% by mass to 0.2% by mass of Ge and if the remainder consist of Bi and inevitable impurities. By adding Sb and Ge by the load in the above-described ranges, a more excellent wettability can be achieved. In addition, the alloy can be allowed to have a metal structure in which no precipitation occurs, and thereby the working characteristic can be further improved.

Note that in the ternary solder alloy according to the present embodiment, the loads of Sb and Ge can be limited to the loads described above in the first and the second embodiments as the more preferable ranges, and the advantages described above are maintained in this case.

The solder alloy according to the present embodiment can be prepared by melting the stocks of a base metal constituted by a Bi—Ge material and a base metal constituted by a Bi—Sb material in an electric furnace.

The solder alloy according to the present embodiment can be also worked in the form of a plate-like preform material, a formed solder, or a solder paste prepared by powdering the solder alloy and mixing the powdered solder with a flux. If the solder alloy is used as a solder paste, the particle size of the powdered solder, the type of the flux, and the suitable composition of the flux are the same as those described above in the first embodiment. In addition, the method of use and the bonding method in the case in which the solder alloy is provided in the form of a formed solder are the same as those described above in the first embodiment.

Fourth Embodiment: A Bi—Sb—Ge—Ni Quaternary Alloy

According to the fourth embodiment of the present invention, a solder alloy for die bonding contains 0.05% by mass to 3.0% by mass of Sb, 0.01% by mass to 1.0% by mass of Ge, and 0.01% by mass to 0.1% by mass of Ni, and the remainder consists of Bi and inevitable impurities.

Further, it is more preferable that the solder alloy according to the present embodiment contain 0.05% by mass to 1.0% by mass of Sb, 0.01% by mass to 0.2% by mass of Ge, and 0.01% by mass to 0.1% by mass of Ni and that the remainder consist of Bi and inevitable impurities.

By adding Ni by the load in the above-described range, not only can the advantages of the compositions described above in the first to the third embodiments be obtained, but also excessive generation of $Bi_3Ni$ that may be locally crystallized can be suppressed and also degradation of the bondability and the reliability can be prevented. In addition, the present embodiment is advantageous because the heat resistance of the solder alloy can be improved due to the heat resistance characteristic that Ni per se includes.

The solder alloy according to the present embodiment can be prepared by melting the stocks of a base metal constituted by a Bi—Ge material, a base metal constituted by a Bi—Sb material, and a base metal constituted by a Bi—Ni material in an electric furnace. In addition, the solder alloy according to the present embodiment can be also worked in the form of a plate-like preform material, a formed solder, or a solder paste prepared by powdering the solder alloy and mixing the powdered solder with a flux. If the solder alloy is used as a solder paste, the particle size of the powdered solder, the type of the flux, and the suitable composition of the flux are the same as those described above in the first embodiment. In addition, the method of use and the bonding method in the case in which the solder alloy is provided in the form of a formed solder are the same as those described above in the first embodiment.

Further, Ni can be added by the load of 0.01% by mass to 0.1% by mass not only to the quaternary composition specifically described above but also to all the compositions of the first, the second, and the third embodiments described herein, which is advantageous for all the above compositions in order to improve the heat resistance and the bondability and also advantageous in order to achieve the effect of suppressing substances that may be crystallized in an excessive amount.

Fifth Embodiment: A Bi—Sb—Ge—P Quaternary Alloy and a Bi—Sb—Ge—Ni—P Quinary Alloy According to the fifth embodiment of the present invention, a solder alloy for die bonding contains 0.05% by mass to 3.0% by mass of Sb, 0.01% by mass to 1.0% by mass of Ge, and 0.001% by mass to 0.1% by mass of P, and the remainder consists of Bi and inevitable impurities. It is more preferable that the solder alloy according to the present embodiment contain 0.05% by mass to 1.0% by mass of Sb, 0.01% by mass to 0.2% by mass of Ge, and 0.001% by mass to 0.1% by mass of P and if the remainder consist of Bi and inevitable impurities. The content of P is more preferably 0.001% by mass to 0.05% by mass. This is because if the content of P is 0.05% by mass or higher, a phase rich in P may be generated and thereby degradation of the impact strength may occur in some cases. In addition, as illustrated in a diagram of a Bi—P binary phase (not shown), it is considered that only an extremely small amount of P acts on Bi. Accordingly, the more suitable load is 0.001% by mass to 0.05% by mass.

Alternatively, the solder alloy according to the present embodiment is a quinary solder alloy for die bonding containing 0.05% by mass to 3.0% by mass of Sb, 0.01% by mass to 1.0% by mass of Ge, 0.01% by mass to 0.1% by mass of Ni, and 0.001% by mass to 0.1% by mass of P, and the remainder consists of Bi and inevitable impurities. It is more preferable that the solder alloy according to the present embodiment contain 0.05% by mass to 1.0% by mass of Sb, 0.01% by mass to 0.2% by mass of Ge, 0.01% by mass to 0.1% by mass of Ni, and 0.001% by mass to 0.1% by mass of P and that the remainder consist of Bi and inevitable impurities. In addition, in the quinary solder alloy for die bonding described above also, it is preferable that the content of P be 0.001% by mass to 0.05% by mass due to the same reasons as described above.

By adding P by the load in the range described above, oxidation of Bi can be prevented, and thereby the bondability can be improved. In addition, the present embodiment is advantageous also in the point that it improves the workability in preparing a powdered alloy by working the solder alloy.

The solder alloy according to the present embodiment can be prepared by melting the stocks of a base metal constituted by a Bi—Ge material, a base metal constituted by a Bi—Sb material, and a base metal constituted by a Bi—P material, and optionally the stocks of a base metal constituted by a Bi—Ni material, in an electric furnace. In addition, the solder alloy according to the present embodiment can be also worked in the form of a plate-like preform material, a formed solder, or a solder paste prepared by powdering the solder alloy and mixing the powdered solder with a flux. If the solder alloy is used as a solder paste, the particle size of the powdered solder, the type of the flux, and the suitable composition of the flux are the same as those described above in the first embodiment. In addition, the method of use and the bonding method in the case in which the solder alloy is provided in the form of a formed solder are the same as those described above in the first embodiment.

Further, P can be added by the load of 0.001% by mass to 0.1% by mass, preferably by the load of 0.001% by mass to 0.05% by mass, not only to the quaternary composition and the quinary composition specifically described above, but also to all the compositions of the first, the second, and the third embodiments described herein, which is advantageous for all the above compositions in order to suppress oxidation and improve the workability characteristics in working the solder alloy into powder while maintaining the characteristics such as the temperature characteristics, the workability, and the wettability at the same time.

EXAMPLES (1) Influence on the Wettability Applied Due to the Presence of the Elements Added to a Bi-Based Alloy (Formed Solder)

The wetting and spreading property in the case in which Ge and Sb were added to Bi as additive elements was measured. In the bonding, a φ6.0×t 0.2 mm formed solder was used, the flux was applied onto an Ni-coated plate by using a φ6.5×t 0.2 mm metal mask, and the formed solder was mounted thereon to perform the soldering by reflow soldering. In this process, the preheating was carried out at 170 to 200° C. for 120 seconds, and the reflow soldering was carried out at the primary heating peak temperature of 300° C. under the temperature profile in which the temperature was maintained at 270° C. or higher for 50 seconds. With respect to the method of preparing the flux used in the process, 50 mass parts of a polymerized rosin, 46 mass parts of butyl carbitol, 0.5 mass parts of a cyclohexylamine HBr salt, 0.5 mass parts of adipic acid, and 3 mass parts of a hydrogenated castor oil were charged into a container, and the mixture was heated and melted at 150° C.

The wetting and spreading property was measured as a rate of spread by using a method compliant with JIS Z3197: 1999 and calculated in accordance with the following expression.

Rate of spread (%)=(diameter obtained by regarding the solder as a sphere−height of the spread solder)/diameter obtained by regarding the solder as a sphere×100

Figure 3A:
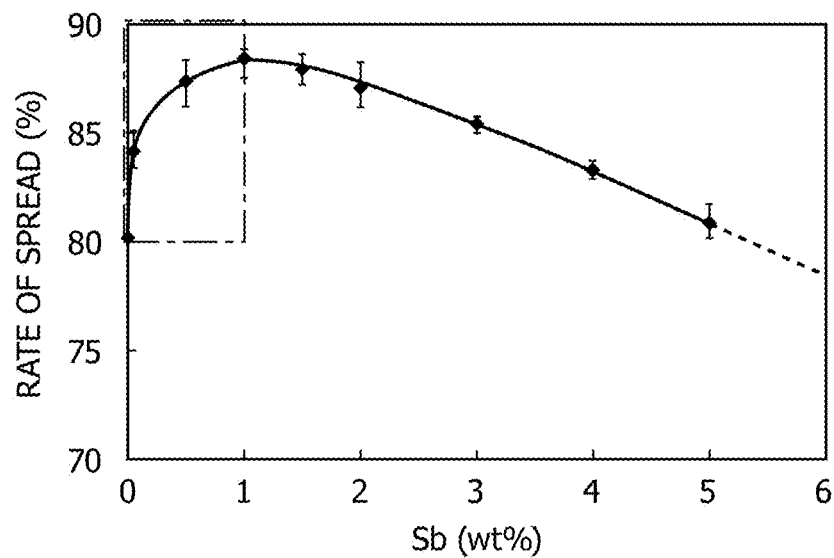
FIGS. 3(a) and 3(b) are diagrams that illustrate a rate of spread of a Bi—Sb-based solder alloy according to the present invention.
Figure 3B:
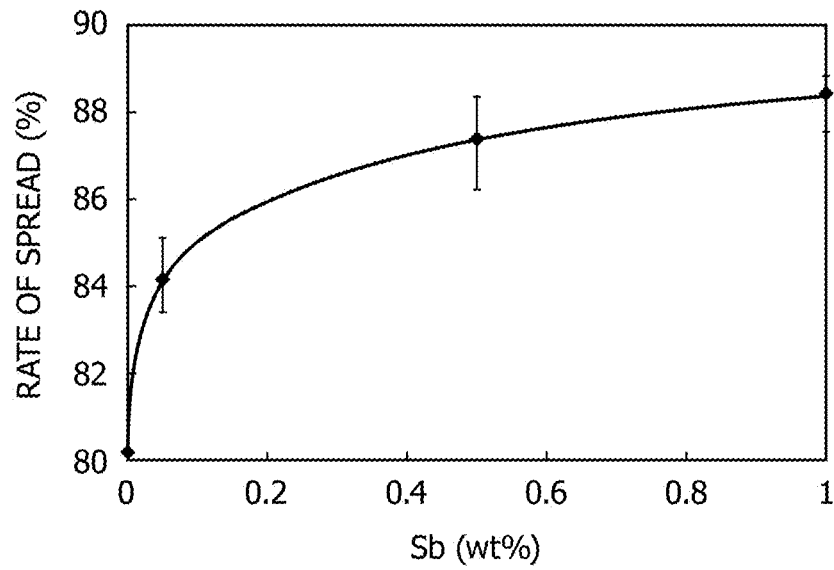
Figure 4A:
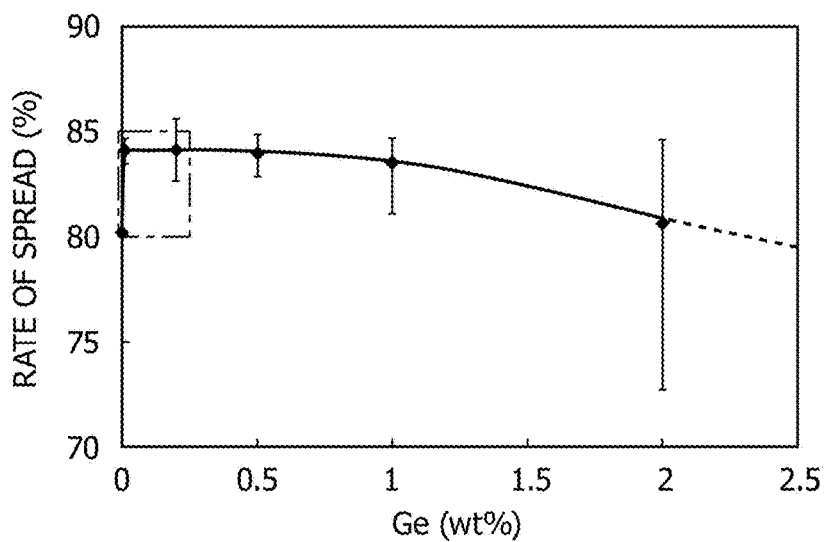
FIGS. 4(a) and 4(b) are diagrams that illustrate a rate of spread of a Bi—Ge-based solder alloy according to the present invention.
Figure 4B:
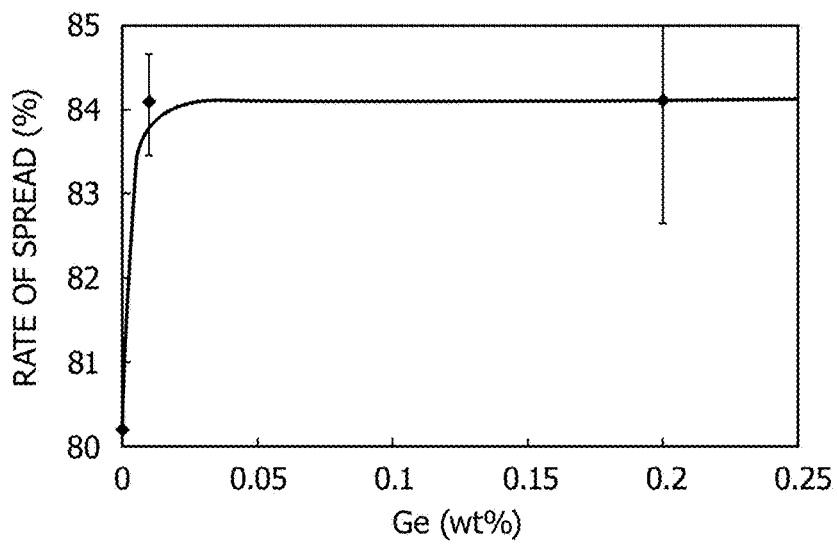

The wettability of Bi-based formed solders will be illustrated in Table 1 and FIGS. 3 and 4. It has been known that the wettability of Bi is lower than that of conventionally used Pb—Sn-based solders. Referring to FIG. 3, when Sb was added to Bi, it was observed that the wettability improved at the addition of Sb by the load of 0.05% by mass, the wettability peaked at an addition of Sb by the load of 1% by mass, and it was examined that the wettability remarkably improved until the addition of Sb by the load of 3% by mass. Referring to FIG. 4, when Ge was loaded to Bi, the wetting and spreading property improved in the range of the load of Ge of 0.01% by mass to 2% by mass, and the wettability was especially excellent until the addition of Ge by the load of 1% by mass. Further, referring to Table 1, when Ge and Sb were combined with each other and added to Bi, it was examined that the wettability improved in the range of load of Ge of 0.01% by mass to 1% by mass and in the range of load of Sb of 0.05% by mass to 3% by mass. With respect to the compositions of Comparative Example 2 and 3, no wettability was observed and thus the wettability was not available for measurement, and also the rate of spread was not calculatable.

sonably estimated that the solder alloy has wettability similar to that of the solder alloy which includes any of the alloy structures containing 0.1% by mass of Ni.

TABLE 1

| Sample | Composition of solder alloy [% by mass] | | | Wettability and rate of spread [%] | Workability of rolling | Structure of alloy |
|---|---|---|---|---|---|---|
| | Bi | Ge | Sb | | | |
| Comparative Example 1 | 100 | — | — | 80.2 | ○ | Rough |
| Example 1 | Remainder | 0.01 | — | 84.1 | ○ | Rough |
| Example 2 | Remainder | 0.2 | — | 84.1 | ○ | Rough |
| Example 3 | Remainder | 0.5 | — | 84.0 | ○ | Rough and a small amount of precipitate |
| Example 4 | Remainder | 1 | — | 83.5 | ○ | Rough and a small amount of precipitate |
| Example 5 | Remainder | 2 | — | 80.7 | Δ | Rough and a large amount of precipitate |
| Comparative Example 2 | Remainder | 3 | — | — | x | Rough and a large amount of precipitate |
| Example 6 | Remainder | — | 0.05 | 84.1 | ○ | Rough |
| Example 7 | Remainder | — | 0.5 | 87.4 | ○ | Rough |
| Example 8 | Remainder | — | 1 | 88.4 | ○ | Rough |
| Example 9 | Remainder | — | 1.5 | 88.0 | ○ | Rough |
| Example 10 | Remainder | — | 2 | 87.1 | ○ | Rough |
| Example 11 | Remainder | — | 3 | 85.5 | ○ | Rough |
| Comparative Example 4 | Remainder | — | 4 | 83.3 | Δ | Fine |
| Comparative Example 5 | Remainder | — | 5 | 80.9 | Δ | Fine |
| Comparative Example 3 | Remainder | — | 7.5 | — | x | Extremely fine |
| Example 12 | Remainder | 0.01 | 0.05 | 84.6 | ○ | Rough |
| Example 13 | Remainder | 0.2 | 1 | 88.2 | ○ | Rough |
| Example 14 | Remainder | 1 | 3 | 84.9 | Δ | Rough and a small amount of precipitate |

(2) Influence on the Wettability Applied Due to the Presence of the Elements Added to a Bi-Based Alloy (Solder Paste)

A powder of a solder in which Ge and Sb were added to Bi was prepared, and the wettability of the solder paste was evaluated. The above-described flux and the solder powder (particle size: 25 to 45 μm) were charged into a container at the mass ratio of 11:89, and the mixture was stirred to prepare the solder paste. The solder paste was applied onto a Ni-coated plate and a Cu plate by using a φ6.5×t 0.2 mm metal mask and the reflow soldering was carried out under the profile described above.

FIG. 5 illustrates the wetting and spreading property of the Bi-based solder paste. It was observed that the wettability of a solder including Bi alone and a solder including Ni added to Bi was very low on a Cu plate, while the wetting and spreading property improved greatly on an alloy to which Ge was added, an alloy to which Sb was added, and an alloy to which both were added, and also it was examined that the wettability on an Ni-coated plate improved.

As can be known from FIG. 5, the wettability on the Ni-coated plate was higher than that on the Cu plate, and because Ni easily forms a compound with Bi, the main constituent, and thus Bi$_3$Ni was easily generated. It was considered that the easy generation of Bi$_3$Ni influenced the wettability. Note that with respect to the data of the wettability on the Ni-coated plate in these Examples, it is rea- (3) Influence on the Alloy Structure and the Workability Applied Due to the Presence of the Elements Added to a Bi-Based Alloy A formed solder constituted by the Bi-based alloy was worked by hot rolling at the temperature ranging from 100° C. to the melting point. The rollability of the formed solder is shown in Table 1. In Table 1, "○ (circle)" indicates that the workability of the solder alloy was excellent, "Δ (triangle)" simply indicates that the solder alloy was workable, and "x (cross)" indicates that the solder alloy was not workable.

Figure 6:
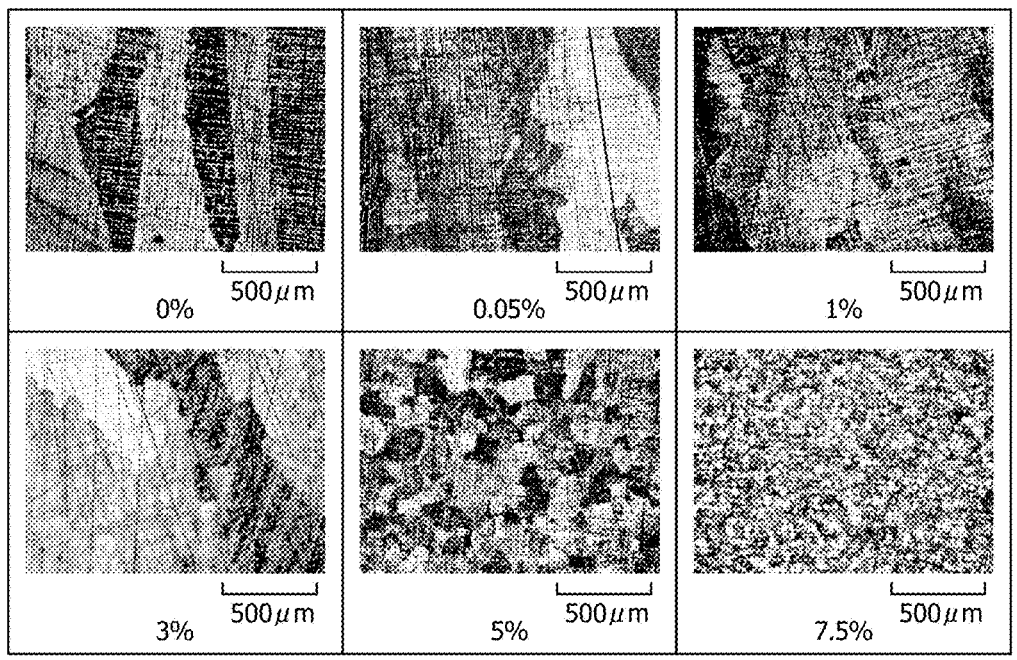
FIG. 6 illustrates micrographs that show a relationship between the load of Sb and a metal structure of a Bi—Sb-based alloy, in which the unit "%" denotes "% by mass".

In the cases in which Sb was added, the solder alloy was rollable up to the addition of Sb by the load of 5% by mass; however, the difficulty of the rolling became high for the range in excess of addition of Sb by the load of 3% by mass. Referring to the structure photographs illustrated in FIG. 6, it was found that up to the addition of Sb by the load of 3% by mass, the structure was close to that of the case of using Bi alone with a high rollability at high temperatures; however, in the range in excess of the load of 3% by mass, the structure became fine, the characteristics of the solder alloy obtained when using Bi alone degraded, the rollability thereby degraded, and the rollability considerably degraded in the range of the load of 7.5% by mass or higher because the structure had become very fine. Note that "Rough" illustrated in Table 1 in the column for the structure indicates a structure in which the grain size of the primary crystal structure, to which no material had been added, was in the range of about several millimeters to several hundred μm.

"Fine" indicates a structure in which the grain size of the structure was 50% or smaller of that of a rough structure, and "Extremely fine" indicates a structure in which the grain size of the structure was about 30% or smaller of that of a rough structure, i.e., a structure to which no material had been added.

Figure 7:
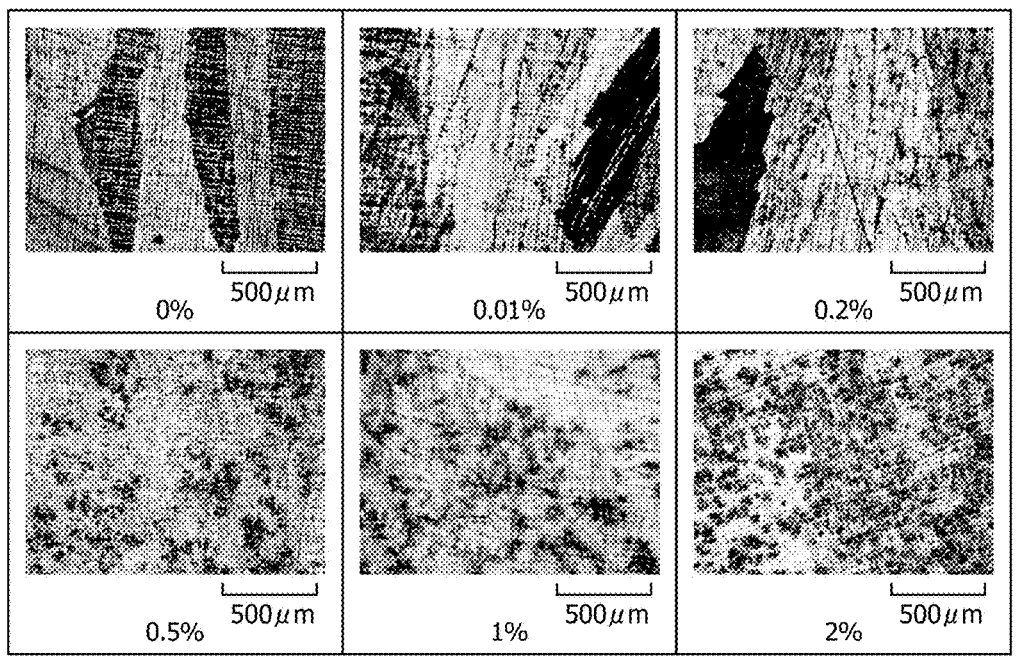
FIG. 7 illustrates micrographs that show a relationship between the load of Ge and a metal structure of a Bi—Ge-based alloy, in which the unit "%" denotes "% by mass".

In the case in which Ge was loaded, the solder alloy was rollable up to an addition of Ge by the load of 2% by mass; however, the difficulty of the rolling became high for the range of the load of Ge by 1% by mass or more. It was considered that this occurred because, as illustrated in the structure photographs shown in FIG. 7, the amount of precipitated Ge became large for the range of the load of Ge by 2% by mass or more.

INDUSTRIAL APPLICABILITY

The solder alloy according to the present invention is used generally for electronic devices in portions of a semiconductor chip and the like to be bonded by die bonding. Specifically, the solder alloy according to the present invention is suitably used for bonding of packaged components such as integrated circuits (ICs). In addition, the solder alloy according to the present invention is suitably used for die bonding of portions of components in which high heat is generated, e.g., power semiconductor devices such as light-emitting diodes (LEDs) or power diodes, and further for die bonding of portions of internal bonding of an IC devices of electronic devices in general. In addition, the solder alloy according to the present invention can be applied to products such as illumination components that use the LEDs described above, drive circuits of inverter devices, power conversion devices such as power modules, and the like.

The invention claimed is:

1. A solder alloy for die bonding consisting of bismuth, 0.05% by mass to 3.0% by mass of antimony, 0.01% by mass to 1.0% by mass of germanium and inevitable impurities.

2. A solder alloy for die bonding consisting of bismuth, 0.05% by mass to 3.0% by mass of antimony, 0.01% by mass to 0.1% by mass of nickel and inevitable impurities.

3. A solder alloy for die bonding consisting of bismuth, 0.05% by mass to 3.0% by mass of antimony, 0.01% by mass to 1.0% by mass of germanium, 0.01% by mass to 0.1% by mass of nickel and inevitable impurities.

4. A solder alloy for die bonding consisting of bismuth, 0.05% by mass to 3.0% by mass of antimony, 0.01% by mass to 1.0% by mass of germanium, 0.001% by mass to 0.1% by mass of phosphorus and inevitable impurities.

5. A solder alloy for die bonding consisting of bismuth, 0.05% by mass to 3.0% by mass of antimony, 0.01% by mass to 0.1% by mass of nickel, 0.001% by mass to 0.1% by mass of phosphorus and inevitable impurities.

6. A solder alloy for die bonding consisting of bismuth, 0.05% by mass to 3.0% by mass of antimony, 0.01% by mass to 1.0% by mass of germanium, 0.01% by mass to 0.1% by mass of nickel, 0.001% by mass to 0.1% by mass of phosphorus and inevitable impurities.

7. A solder alloy for die bonding consisting of bismuth, 0.01% by mass to 2.0% by mass of germanium and inevitable impurities.

8. A solder paste comprising: the solder alloy for die bonding according to claim 7 and a flux.

* * * * *